(12) United States Patent
Hong et al.

(10) Patent No.: US 10,840,711 B2
(45) Date of Patent: Nov. 17, 2020

(54) METHOD AND SYSTEM FOR EFFECTIVE BATTERY CELL BALANCING THROUGH DUTY CONTROL

(71) Applicant: LG CHEM, LTD., Seoul (KR)

(72) Inventors: Sung Ju Hong, Cheongju-Si (KR); Dong Hyun Kim, Sejong (KR); Seog Jin Yoon, Cheongju-Si (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/076,431

(22) PCT Filed: Oct. 17, 2017

(86) PCT No.: PCT/KR2017/011445
§ 371 (c)(1),
(2) Date: Aug. 8, 2018

(87) PCT Pub. No.: WO2018/074807
PCT Pub. Date: Apr. 26, 2018

(65) Prior Publication Data
US 2019/0052098 A1    Feb. 14, 2019

(30) Foreign Application Priority Data

Oct. 21, 2016 (KR) .......................... 10-2016-0137840

(51) Int. Cl.
*H02J 7/00* (2006.01)
*H01M 10/48* (2006.01)
(Continued)

(52) U.S. Cl.
CPC ............ *H02J 7/0016* (2013.01); *G01R 31/36* (2013.01); *H01M 2/1016* (2013.01);
(Continued)

(58) Field of Classification Search
CPC .... H02J 7/0016; H02J 7/0091; H01M 2/1016; H01M 10/425
See application file for complete search history.

(56) References Cited

U.S. PATENT DOCUMENTS

2003/0076642 A1* 4/2003 Shiner .................... H02J 7/0031
361/91.6
2005/0127873 A1* 6/2005 Yamamoto ............ H02J 7/0016
320/116
(Continued)

FOREIGN PATENT DOCUMENTS

CN         103441542 A    12/2013
CN         104283249 A     1/2015
(Continued)

OTHER PUBLICATIONS

European Search Report for Appl. No. 17861377.4 dated Feb. 12, 2019.
(Continued)

*Primary Examiner* — Richard Isla
*Assistant Examiner* — Johali A Torres Ruiz
(74) *Attorney, Agent, or Firm* — Birch, Stewart, Kolasch & Birch, LLP

(57) ABSTRACT

The present disclosure relates to battery cell balancing using duty ratio control, and more particularly, to a battery cell balancing method and system with improved accuracy and efficiency by detecting a temperature of a resistance caused by a current flowing in a battery cell during battery cell balancing, calculating a duty ratio of the battery cell balancing according thereto, and detecting a voltage of the battery cell when a predetermined time elapses after the cell balancing operation.

6 Claims, 2 Drawing Sheets

(51) Int. Cl.
*H01M 10/42* (2006.01)
*G01R 31/36* (2020.01)
*H01M 2/10* (2006.01)

(52) U.S. Cl.
CPC ......... *H01M 10/42* (2013.01); *H01M 10/425* (2013.01); *H01M 10/48* (2013.01); *H01M 2010/4271* (2013.01)

(56) References Cited

U.S. PATENT DOCUMENTS

| | | | |
|---|---|---|---|
| 2010/0079116 A1* | 4/2010 | Thivierge | B60L 3/04 320/153 |
| 2010/0194339 A1 | 8/2010 | Yang et al. | |
| 2012/0133330 A1 | 5/2012 | Kamata et al. | |
| 2013/0113280 A1* | 5/2013 | Yang | H02J 7/0016 307/19 |
| 2014/0042972 A1 | 2/2014 | Kim et al. | |
| 2014/0184168 A1 | 7/2014 | Park | |
| 2014/0225622 A1* | 8/2014 | Kudo | B60L 7/14 324/433 |
| 2015/0155602 A1* | 6/2015 | Hwang | H01M 10/4207 429/50 |
| 2016/0159243 A1* | 6/2016 | Park | B60L 11/1866 320/136 |

FOREIGN PATENT DOCUMENTS

| | | |
|---|---|---|
| EP | 2 590 296 A1 | 5/2013 |
| EP | 2 787 594 A2 | 10/2014 |
| JP | WO2013/021589 A1 | 2/2013 |
| JP | 2013-123274 A | 6/2013 |
| JP | 2013-236492 A | 11/2013 |
| JP | 2014-73051 A | 4/2014 |
| JP | 2014-183727 A | 9/2014 |
| JP | 2015/133766 A | 7/2015 |
| KR | 10-2012-0026417 A | 3/2012 |
| KR | 10-2013-0049706 A | 5/2013 |
| KR | 10-2014-0021904 A | 2/2014 |
| KR | 10-2014-0084691 A | 7/2014 |

OTHER PUBLICATIONS

International Search Report (PCT/ISA/210) issued in PCT/KR2017/011445, dated Feb. 19, 2018.

* cited by examiner

[FIG. 1]
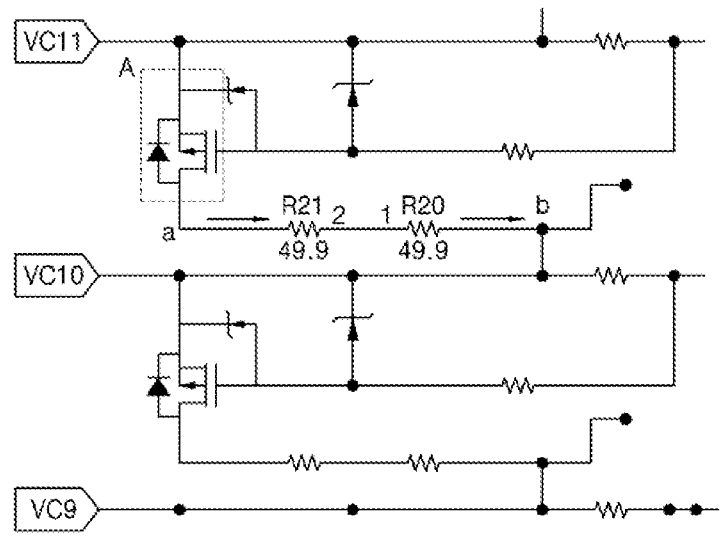
[FIG. 2]
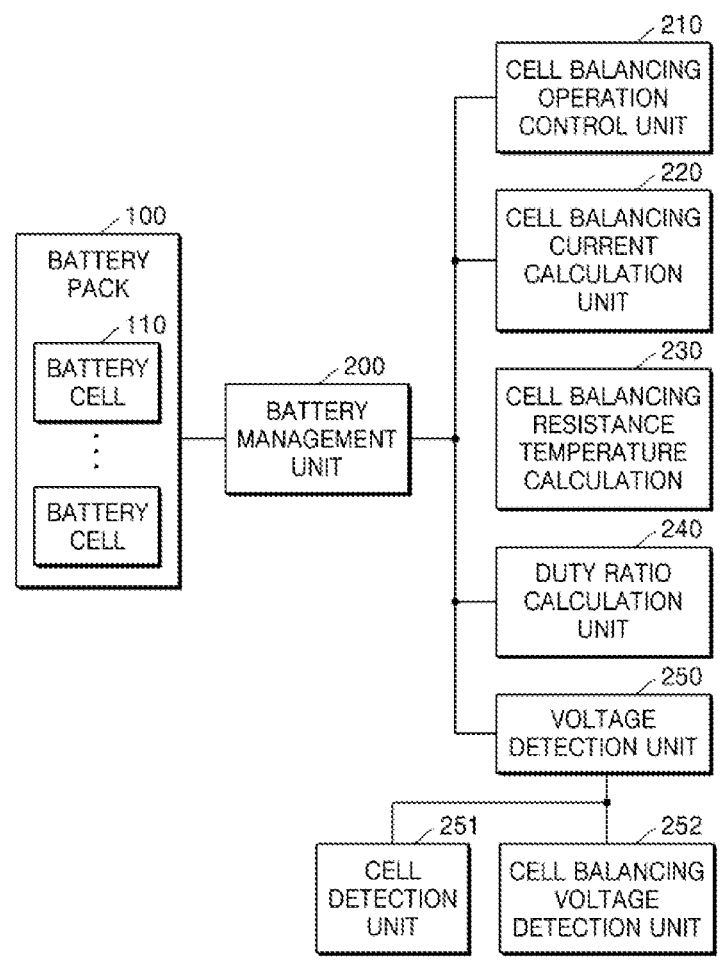

[FIG. 3]
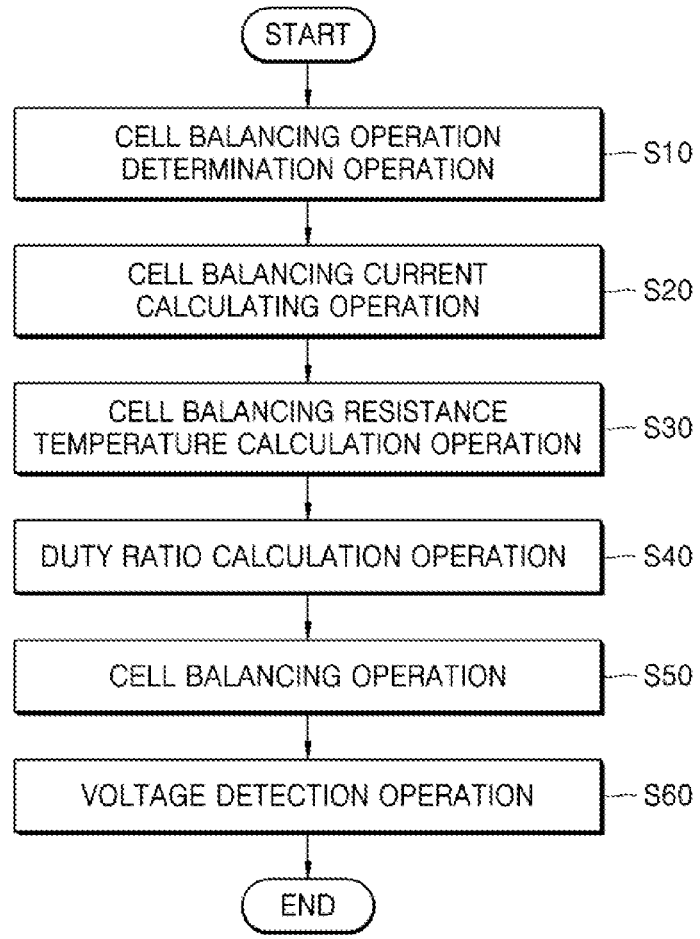
[FIG. 4]
(a)
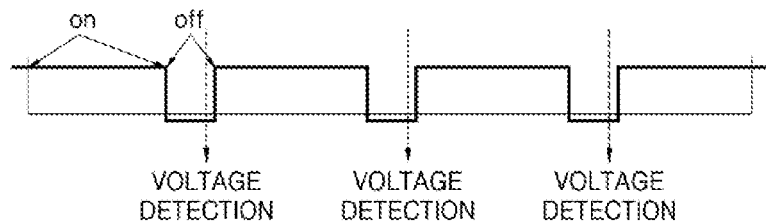
(b)
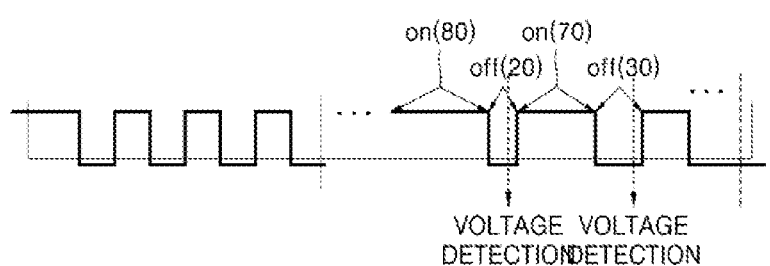

METHOD AND SYSTEM FOR EFFECTIVE BATTERY CELL BALANCING THROUGH DUTY CONTROL

BACKGROUND

The present disclosure relates to battery cell balancing using duty ratio control, and more particularly, to a battery cell balancing method and system with improved accuracy and efficiency by detecting a temperature of a resistance caused by a current flowing in a battery cell during battery cell balancing, calculating a duty ratio of the battery cell balancing according thereto, and detecting a voltage of the battery cell when a predetermined time elapses after the cell balancing operation.

A battery pack, which is generally mounted in a device requiring a rechargeable electric storage device, such as an energy storage device, an electric vehicle, a portable electronic device, etc., includes a plurality of battery cells connected in series or in parallel. When the battery pack including the plurality of battery cells is discharged, a difference in the charging state of each cell occurs over time due to the difference in the self-discharge rate of each cell. If the discharging of the battery pack continues in such an unbalanced charging state, a specific cell with a low charging state is overdischarged, so that a stable operation of the battery pack becomes difficult. Also, when a specific battery cell is overcharged during a charging process, this interferes with the stable operation of the battery pack.

Overcharging or overdischarging of a specific battery cell occurring in such a way reduces the capacity of the battery pack and also deteriorates the battery pack and shortens the service life.

Therefore, as a method for efficiently managing the battery pack, battery cell balancing, which adjusts a voltage difference between each of battery cells constituting the battery pack to be within or identical to a predetermined allowable range, should be essentially performed.

Conventionally, balancing between battery cells has been performed through a method of selecting a balancing target cell and balancing it for a predetermined time when a change in the open voltage of the battery cell with respect to the charging state of the battery cell is equal to or greater than a reference value, a method of determining completion of the balancing operation by monitoring the voltage of each battery cell in real time during the balancing control operation of the battery cell, and a method of measuring the voltage of each battery cell and setting one of the measured voltages as a balancing reference voltage to perform balancing by charging/discharging according to a reference voltage.

However, in the conventional methods, there is a problem of resistance heat due to the continuous current flowing during battery cell balancing, and since the time required until the voltage detection time after the battery cell balancing is constant regardless of the size of the current flowing during cell balancing, the accuracy and efficiency of cell balancing are reduced.

SUMMARY

The present disclosure provides a battery cell balancing method for minimizing a heat generation issue due to a resistance, which is caused by a current flowing during cell balancing and controlling a time to a voltage detection time point after the cell balancing in order to improve efficiency.

In accordance with an exemplary embodiment, provided is a battery cell balancing system for balancing a voltage of at least two battery cells included in a battery pack, the system includes: a battery pack including two or more battery cells; and a battery management unit configured to control battery cell balancing, wherein the battery management unit includes: a cell balancing operation control unit configured to determine whether a battery cell balancing operation condition is satisfied and apply an on/off signal to a cell balancing control FET to control a cell balancing operation; a cell balancing current calculation unit configured to measure the size of a cell balancing current during the cell balancing operation; a cell balancing resistance temperature calculation unit configured to calculate a temperature of a cell balancing resistance generated by the cell balancing current flowing during the cell balancing operation; a duty ratio calculation unit configured to calculate a duty ratio with respect to an on/off period of the cell balancing control FET according to the calculated temperature value of the cell balancing resistance; and a voltage detection unit configured to detect a voltage of the battery cells.

The duty ratio calculation unit may detect a temperature section to which the temperature value of the resistance calculated by the cell balancing resistance temperature calculation unit belongs and calculate a duty ratio with respect to an on/off signal of the cell balancing control FET corresponding to the detected temperature section to provide the duty ratio to the cell balancing operation control unit.

The voltage detection unit may include: a cell detection unit configured to calculate a deviation of the voltage of the battery cells and determine that battery cell balancing is required when at least one of the voltage deviations of each of the battery cells is equal to or greater than a predetermined reference value to detect a cell that requires balancing; and a cell balancing voltage detection unit configured to detect a voltage of a cell to which the cell balancing is applied after the cell balancing control FET is turned off, and compare the voltage with a predetermined reference value to determine whether the cell balancing is successful or not.

After the cell balancing control FET is turned off, when a predetermined time elapses, the cell balancing voltage detection unit may operate.

The cell balancing operation control unit may control the cell balancing control FET with an on/off control signal having a predetermined duty ratio at the start of the cell balancing and then control the on/off of the cell balancing control FET with a duty ratio calculated according to a temperature of a resistance generated when the cell balancing operates.

In accordance with another exemplary embodiment, provided is a battery cell balancing method for balancing a voltage of at least two battery cells included in a battery pack. The method includes: a cell balancing operation determination operation of determining whether a battery cell balancing operation condition is satisfied and controlling a cell balancing operation by applying an on/off signal to the cell balancing control FET according to the determination result; a cell balancing current calculating operation of measuring and calculating the size of a cell balancing current during the cell balancing operation; a cell balancing resistance temperature calculation operation of calculating a temperature of a cell balancing resistance generated by the cell balancing current during the cell balancing operation; a duty ratio calculation operation of calculating a duty ratio with respect to an on/off period of the cell balancing control FET according to the calculated temperature value of the cell balancing resistance; a cell balancing operation of applying an on/off signal to the cell balancing control FET according to the calculated duty ratio to operate cell balancing; and a voltage detection operation of detecting a voltage of the battery cells.

The duty ratio calculation operation may detect a temperature section to which the temperature value of the resistance calculated in the cell balancing resistance temperature calculation operation and calculate a duty ratio with respect to an on/off period of the cell balancing control FET corresponding to the detected temperature section.

The voltage detection operation may detect a voltage of a cell to which the balancing is applied when a predetermined time elapses after the cell balancing control FET is turned off, and compare the voltage with a predetermined reference value to determine whether the cell balancing is successful or not.

The cell balancing operation determination operation may control the on/off the cell balancing control FET with an on/off control signal having a predetermined duty ratio at the start of the cell balancing operation and then apply an on/off signal according to an on/off duty ratio calculated in the duty ratio calculation operation.

BRIEF DESCRIPTION OF THE DRAWINGS

Exemplary embodiments can be understood in more detail from the following description taken in conjunction with the accompanying drawings, in which:

FIG. 1 is a circuit diagram illustrating a an embodiment of a configuration of the present invention;

FIG. 2 is an overall system block diagram of the present invention;

FIG. 3 is a diagram illustrating operations according to the present invention; and FIG. 4 is a comparative example according to overall operations of cell balancing.

DETAILED DESCRIPTION OF EMBODIMENTS

Hereinafter, embodiments of the present invention will be described in detail with reference to the accompanying drawings so that those skilled in the art can easily carry out the present invention. The present invention may, however, be embodied in different forms and should not be construed as limited to the embodiments set forth herein. Parts not relating to description are omitted in the drawings in order to clearly describe the present invention and like reference numerals refer to like elements throughout.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements if there is no specific limitation. The term "~ing operation" or "operation of ~ing" used throughout the specification does not mean "operation for ~ing".

A battery cell balancing method for balancing a voltage of at least two battery cells included in a battery pack includes: a cell balancing operation determination operation of determining whether a battery cell balancing operation condition is satisfied and controlling a cell balancing operation by applying an on/off signal to the cell balancing control FET according to the determination result; a cell balancing current calculating operation of measuring and calculating the size of a cell balancing current during the cell balancing operation; a cell balancing resistance temperature calculation operation of calculating a temperature of a cell balancing resistance generated by the cell balancing current during the cell balancing operation; a duty ratio calculation operation of calculating a duty ratio with respect to an on/off period of the cell balancing control FET according to the calculated temperature value of the cell balancing resistance; a cell balancing operation of applying an on/off signal to the cell balancing control FET according to the calculated duty ratio to operate cell balancing; and a voltage detection operation of detecting a voltage of the battery cells.

The duty ratio referred to in the present invention means the ratio of the time when the on/off signal of the cell balancing control FET is applied Prior to the detailed description, the configuration of the present invention will be described with reference to FIG. 1.

Referring to the circuit diagram of FIG. 1, the portion denoted by A is a cell balancing control FET mentioned in the present invention. A current for cell balancing may flow or be cut off according to on/off of the cell balancing control FET.

The cell balancing current mentioned in the present invention is the current flowing during a cell balancing operation. For example, the call balancing current refers to the current flowing between the a-b terminals after the cell balancing control FET is turned on.

In addition, the cell balancing resistance mentioned in the present invention is a resistance formed in a section where the cell balancing current flows during a cell balancing operation. For example, it may be R21 and R20 between the a-b terminals in FIG. 1.

Therefore, the present invention may control the on/off period of the cell balancing control FET according to the temperature of the cell balancing resistance generated by the cell balancing current.

Hereinafter, the present invention will be described in detail with reference to the remaining drawings.

FIG. 2 is a block diagram showing the overall system configuration according to the present invention.

Referring to FIG. 2, a system for cell balancing of a battery according to the present invention includes a battery pack 100 and a battery management unit 200.

The battery pack 100 may include at least two battery cells 110 connected in series and in parallel.

The battery management unit 200 for controlling the balancing of the battery cells 110 constituting the battery pack 100 includes a cell balancing operation control unit 210, a cell balancing current calculation unit 220, a cell balancing resistance temperature calculation 230, a duty ratio calculation unit 240, and a voltage detection unit 250. The voltage detection unit 250 may include a cell detection unit 251 and a cell balancing voltage detection unit 252.

The cell balancing operation control unit 210 may determines whether the operation condition of balancing the battery cell 110 is satisfied and control the cell balancing operation by applying an on/off signal to the cell balancing control FET according to the determination result.

The cell balancing operation control unit 210 may control the cell balancing control FET to turn on/off with an on/off control signal having a predetermined duty ratio at the start of the cell balancing operation and then, perform a control by applying an on/off signal to the cell balancing control FET according to the duty ratio calculated by the unit 240.

Determining whether the cell balancing operation condition is satisfied may include determining whether to operate by using information about a cell that requires balancing provided by the cell detection unit 251.

The cell detection unit 251 will be described in detail while describing the voltage detection unit 250.

Furthermore, the cell balancing operation control unit 210 may be configured to include various elements generally used as a cell balancing operation condition, including a state of a current flowing during a cell balancing operation calculated by the cell balancing current calculation unit 220 in addition to information provided by the cell detection unit 251.

The cell balancing current calculation unit 220 may measure and calculate the size of the cell balancing current flowing during the cell balancing operation. The method of calculating the size of the current is calculated by using a generally used formula of current=voltage/resistance.

In addition, the cell balancing current calculation unit 220 may detect the state of a current flowing during the cell balancing operation and provide the detected state to the cell balancing operation control unit 210.

A method of calculating a current flowing during the cell balancing operation includes measuring a potential difference across the cell 110 by connecting a current sensing resistor connected in series to the battery cell 110. By using the measured potential difference, a direction in which the current flows in the battery cell 110 may be obtained to detect current charging or discharging, or a state in which current does not flow.

The current sensing resistor is a resistor having an extremely low resistance used for checking what degree current flows in a specific portion of a circuit and since the resistance value is very low, the flow of current is not significantly disturbed, so that the amount of current in the battery cell 110 may be measured.

The cell balancing resistance temperature calculation unit 230 may calculate the temperature value of the cell balancing resistance generated by the cell balancing current flowing during the cell balancing operation.

The temperature value of the cell balancing resistance is calculated using a thermistor. An analog-to-digital converter (ADC) may be used to measure the voltage across the thermistor, and thorough this, a resistance value may be reversely calculated to calculate a temperature value.

The connecting method of the thermistor includes a wire method and a chip resistance method, and in the present invention, may be generally configured including a chip resistance method for designing a chip around a resistor constituting a cell balancing circuit.

The duty ratio calculation unit 240 may detect a temperature section to which the temperature value of the cell balancing resistance calculated by the cell balancing resistance temperature calculation unit 230 belongs and may calculate a duty ratio with respect to an on/off period of the cell balancing control FET corresponding to the detected temperature section.

TABLE 1

| Temperature | Cell balancing operation On | Cell balancing operation Off |
|---|---|---|
| T ≤ 30° C. | 100% | 0% |
| 30 < T ≤ 40° C. | 80% | 20% |
| 40 < T ≤ 50° C. | 60% | 40% |
| 50 < T ≤ 60° C. | 40% | 60% |
| 60 < T ≤ 65° C. | 20% | 80% |
| 65° C. < T | 0% | 100%(cell balancing stop) |

In addition, the duty ratio calculation unit 240 may provide the duty ratio with respect to the on/off of the calculated cell balancing control FET to the cell balancing operation control unit 210.

The voltage detection unit 250 may include a cell detection unit 251 and a cell balancing voltage detection unit 252.

The cell detection unit 251 may calculate the deviation of the voltage of the battery cells 110 and compare the voltage deviation of each of the battery cells 110 with a predetermined reference value to detect the battery cell 110 that requires balancing. When at least one of the voltage deviations of each of the calculated battery cells is equal to or greater than a predetermined reference value, it is determined that battery cell balancing is necessary so that the cell 110 requiring balancing may be detected. In addition, information on the detected cell may be provided to the cell balancing operation control unit 210.

After the cell balancing control FET is turned off, the cell balancing voltage detection unit 252 may detect the voltage of the cell to which the balancing is applied and compare it with a predetermined reference value to determine whether cell balancing is successful or not. In addition, the voltage detection of the battery cell 110 may operate after a predetermined time.

The predetermined time is set differently depending on the performance or characteristics of the system for measuring the voltage of the battery cell 110.

FIG. 3 is a block diagram illustrating an operation of balancing a battery cell according to the present invention.

Referring to FIG. 3, the operation may include a cell balancing operation determination operation S10 of determining whether the battery cell balancing operation condition is satisfied and controlling a cell balancing operation by applying an on/off signal to the cell balancing control FET according to the determination result; a cell balancing current calculating operation S20 of measuring and calculating the size of the cell balancing current during the cell balancing operation; a resistance temperature calculation operation S30 of calculating a temperature of a cell balancing resistance generated by the cell balancing current while the cell balancing operation is performed; a duty ratio calculation operation S40 of calculating a duty ratio with respect to an on/off period of the cell balancing control FET according to the calculated temperature value of the cell balancing resistance; a cell balancing operation S50 of applying an on/off signal to the cell balancing control FET according to the calculated duty ratio to operate cell balancing; and a voltage detection operation S60 of detecting a voltage of the battery cell.

The cell balancing operation determination operation S10 determines whether the balancing operation condition of the battery cell 110 is satisfied and controls the cell balancing operation by applying an on/off signal to the cell balancing control FET according to the determination result.

The cell balancing operation determination operation S10 may control the cell balancing control FET to turn on/off with an on/off control signal having a predetermined duty ratio at the start of the cell balancing operation and after the cell balancing operation, perform a control by applying an on/off signal to the cell balancing control FET according to the duty ratio calculated in duty ratio calculation operation S40.

The method for determining the cell balancing operation condition includes calculating a deviation of the voltage of each battery cell 110 and comparing the calculated voltage deviation with a predetermined reference value to determine whether the balancing operation of the battery cell 110 is satisfied.

When at least one of the calculated voltage deviations is equal to or greater than a predetermined reference value, it may be determined that the battery cell balancing is necessary.

Furthermore, the method of determining the cell balancing operation condition may include various elements generally used as a cell balancing operation condition, including information on the current state flowing in the battery cell in addition to the voltage deviation of the battery cells.

The cell balancing current calculation operation S20 may be an operation of measuring and calculating the size of the cell balancing current during the cell balancing operation. The method of calculating the size of the current is calculated by using a generally used formula of current=voltage/resistance.

The cell balancing resistance temperature calculation operation S30 may be an operation of calculating the temperature of the cell balancing resistance generated by the cell balancing current flowing during the cell balancing operation.

The method of calculating the temperature value of the cell balancing resistance may use a thermistor. An analog-to-digital converter (ADC) may be used to measure the voltage across the thermistor, and thorough this, a resistance value may be reversely calculated to calculate a temperature value.

The connecting method of the thermistor includes a wire method and a chip resistance method, and in the present invention, may be generally configured including a chip resistance method for designing a chip around a resistor constituting a cell balancing circuit.

The duty ratio calculation operation S40 may be an operation of detecting a predetermined temperature section to which the temperature value of the cell balancing resistance calculated in the cell balancing resistance temperature calculation operation S30 belongs and calculating a duty ratio with respect to an on/off signal of the predetermined cell balancing control FET corresponding to the detected temperature section.

The method of calculating a predetermined duty ratio according to the temperature value of the cell balancing resistance may perform calculation by referring to Table 1 as described in FIG. 2.

The cell balancing operation S50 may be an operation of applying an on/off signal to the cell balancing control FET according to the duty ratio calculated in the duty ratio calculating operation S40 in order to perform the cell balancing operation.

The voltage detection operation S60 may detect the voltage of the cell to which balancing is applied when a predetermined time elapses after the cell balancing control FET is turned off in the cell balancing operation S50. The predetermined time may be determined depending on the performance or characteristics of the system for measuring the voltage of the battery cell 110.

FIG. 4 is a diagram illustrating a comparative example of overall cell balancing operations according to the prior art and the present invention.

(a) of FIG. 4 is a diagram illustrating an operation to which a conventional cell balancing control method is applied. As shown in (a) of FIG. 4, it may be confirmed that on/off operates at a predetermined ratio in the cell balancing control FET. Also, it may be confirmed that the time point for detecting the voltage of the cell is constant after the cell balancing control FET is turned off. However, in such a case, cell balancing is performed at a constant time ratio irrespective of the heating problem of the cell balancing resistance due to the cell balancing current flowing during the cell balancing operation. Accordingly, damage to the battery cell 110 due to the heat generation problem of the cell balancing resistance, and degradation of the accuracy and efficiency of the cell balancing operation may occur.

Also, after the cell balancing control FET is turned off in general, the cell voltage is restored to the original OCV voltage after a sufficient time elapses. However, after the conventional cell balancing control FET is turned off, the cell voltage is detected at a predetermined time point without considering the time when the OCV voltage is restored, so that this may degrade the accuracy of the cell voltage detection.

On the other hand, referring to (b) of FIG. 4 to which the present invention is applied, the duty ratio with respect to the on/off period of the cell balancing control FET may be detected according to the temperature of the cell balancing resistance generated by the cell balancing current flowing during the cell balancing operation and accordingly thereto, it may be confirmed that cell balancing operates. Also, the time point when the voltage of the cell 110 is detected after the cell balancing control FET is turned off is flexibly controlled according to the cell feature or the system feature, and measured after the cell voltage is restored to the OCV, so that the cell balancing operation with improved accuracy and efficiency may be achieved.

The present invention performs cell balancing by using a cell balancing duty ratio calculated according to a temperature of a resistance generated by a current flowing during a cell balancing operation of a battery to improve the accuracy of the voltage measurement by detecting the voltage after a predetermined time, and to effectively control the heat generation of the resistance caused by the current flowing during the cell balancing operation, so that balancing between battery cells with improved efficiency may be achieved.

Although the battery cell balancing method and system have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A battery cell balancing system for balancing a voltage of at least two battery cells included in a battery pack, the system comprising:
   the battery pack including the at least two battery cells; and
   a battery management unit configured to control battery cell balancing of the at least two battery cells,
   wherein the battery management unit comprises:
   a cell balancing operation control unit configured to determine whether a battery cell balancing operation condition is satisfied and apply an on/off signal to a cell balancing control FET to control a cell balancing operation of the at least two battery cells;
   a cell balancing current calculation unit configured to measure the size of a cell balancing current of the at least two battery cells during the cell balancing operation;
   a cell balancing resistance temperature calculation unit configured to calculate a temperature of a cell balancing resistance of the at least two battery cells generated by the cell balancing current flowing during the cell balancing operation of the at least two battery cells;
a duty ratio calculation unit configured to calculate a duty ratio with respect to an on/off period of the cell balancing control FET according to the calculated temperature value of the cell balancing resistance; and
a voltage detection unit configured to detect a voltage of the battery cells at a determined time after the cell balancing control FET is turned off,
wherein the duty ratio calculation unit detects a temperature section among a plurality of temperature sections to which the temperature value of the resistance calculated by the cell balancing resistance temperature calculation unit belongs and calculates the duty ratio with respect to the on/off signal of the cell balancing control FET corresponding to the detected temperature section to provide the duty ratio to the cell balancing operation control unit,
wherein the plurality of temperature sections includes:
a first temperature section including temperatures at or below 30° C. having a cell balancing On operation of 100%;
a second temperature section including temperatures above 30° C. and at or below 40° C. having a cell balancing On operation of 80% and a cell balancing Off operation of 20%;
a third temperature section including temperatures above 40° C. and at or below 50° C. having a cell balancing On operation of 60% and a cell balancing Off operation of 40%;
a fourth temperature section including temperatures above 50° C. and at or below 60° C. having a cell balancing On operation of 40% and a cell balancing Off operation of 60%;
a fifth temperature section including temperatures above 60° C. and at or below 65° C. having a cell balancing On operation of 20% and a cell balancing Off operation of 80%; and
a sixth temperature section including temperatures above 65° C. having a cell balancing On operation of 0% and a cell balancing Off operation of 100%, and
wherein the determined time when the voltage of the battery cells is detected after the cell balancing control FET is turned off is flexibly controlled and is after the cell voltage is restored to an OCV.

2. The system of claim 1, wherein the voltage detection unit comprises:
a cell detection unit configured to calculate a deviation of the voltage of the of the at least two battery cells and determine that battery cell balancing is required when at least one of the voltage deviations of each of the of the at least two battery cells is equal to or greater than a predetermined reference value to detect a cell that requires balancing; and
a cell balancing voltage detection unit configured to detect a voltage of a battery cell among of the at least two battery cells to which the cell balancing is applied after the cell balancing control FET is turned off, and compare the voltage with a predetermined reference value to determine whether the cell balancing is successful or not.

3. The system of claim 1, wherein the cell balancing operation control unit controls the cell balancing control FET with an on/off control signal having a predetermined duty ratio at the start of the cell balancing and then controls the on/off of the cell balancing control FET with the duty ratio calculated according to a temperature of a resistance generated when the cell balancing operates.

4. A battery cell balancing method for balancing a voltage of at least two battery cells included in a battery pack, the method comprising:
a cell balancing operation determination operation of determining whether a battery cell balancing operation condition is satisfied and controlling a cell balancing operation of the at least two battery cells by applying an on/off signal to the cell balancing control FET according to the determination result;
a cell balancing current calculating operation of measuring and calculating the size of a cell balancing current during the cell balancing operation of the at least two battery cells;
a cell balancing resistance temperature calculation operation of calculating a temperature of a cell balancing resistance generated by the cell balancing current during the cell balancing operation of the at least two battery cells;
a duty ratio calculation operation of calculating a duty ratio with respect to an on/off period of the cell balancing control FET according to the calculated temperature value of the cell balancing resistance;
a cell balancing operation of applying an on/off signal to the cell balancing control FET according to the calculated duty ratio to operate cell balancing; and
a voltage detection operation of detecting a voltage of the of the at least two battery cells, at a determined time after the cell balancing control FET is turned off,
wherein the duty ratio calculation operation includes detecting a temperature section among a plurality of temperature sections to which the temperature value of the resistance calculated by the cell balancing resistance temperature calculation unit belongs and calculating the duty ratio with respect to the on/off signal of the cell balancing control FET corresponding to the detected temperature section,
wherein the plurality of temperature sections includes:
a first temperature section including temperatures at or below 30° C. having a cell balancing On operation of 100%;
a second temperature section including temperatures above 30° C. and at or below 40° C. having a cell balancing On operation of 80% and a cell balancing Off operation of 20%;
a third temperature section including temperatures above 40° C. and at or below 50° C. having a cell balancing On operation of 60% and a cell balancing Off operation of 40%;
a fourth temperature section including temperatures above 50° C. and at or below 60° C. having a cell balancing On operation of 40% and a cell balancing Off operation of 60%;
a fifth temperature section including temperatures above 60° C. and at or below 65° C. having a cell balancing On operation of 20% and a cell balancing Off operation of 80%; and
a sixth temperature section including temperatures above 65° C. having a cell balancing On operation of 0% and a cell balancing Off operation of 100%, and
wherein the determined time when the voltage of the battery cells is detected after the cell balancing control FET is turned off is flexibly controlled and is after the cell voltage is restored to an OCV.

5. The method of claim 4, wherein the voltage detection operation detects a voltage of a battery cell among the at least two battery cells to which the balancing is applied when a predetermined time elapses after the cell balancing control FET is turned off, and compares the voltage with a predetermined reference value to determine whether the cell balancing is successful or not.

6. The method of claim 4, wherein the cell balancing operation determination operation controls the on/off the cell balancing control FET with an on/off control signal having a predetermined duty ratio at the start of the cell balancing operation and then applies an on/off signal according to an on/off duty ratio calculated in the duty ratio calculation operation.

\* \* \* \* \*